(12) United States Patent
Kim et al.

(10) Patent No.: US 11,874,330 B2
(45) Date of Patent: Jan. 16, 2024

(54) BATTERY MANAGEMENT APPARATUS AND METHOD

(71) Applicant: LG Energy Solution, Ltd., Seoul (KR)

(72) Inventors: Ji-Yeon Kim, Daejeon (KR); Dae-Soo Kim, Daejeon (KR); Young-Deok Kim, Daejeon (KR)

(73) Assignee: LG Energy Solution, Ltd.

( * ) Notice: Subject to any disclaimer, the term of this patent is extended or adjusted under 35 U.S.C. 154(b) by 233 days.

(21) Appl. No.: 17/626,188

(22) PCT Filed: Sep. 9, 2020

(86) PCT No.: PCT/KR2020/012195
§ 371 (c)(1),
(2) Date: Jan. 11, 2022

(87) PCT Pub. No.: WO2021/049882
PCT Pub. Date: Mar. 18, 2021

(65) Prior Publication Data
US 2022/0276314 A1    Sep. 1, 2022

(30) Foreign Application Priority Data

Sep. 11, 2019   (KR) .................. 10-2019-0112936

(51) Int. Cl.
*G01R 31/3842*   (2019.01)
*G01R 31/36*     (2020.01)
(Continued)

(52) U.S. Cl.
CPC ..... *G01R 31/3842* (2019.01); *G01R 31/3644* (2013.01); *H01M 10/425* (2013.01);
(Continued)

(58) Field of Classification Search
None
See application file for complete search history.

(56) References Cited

U.S. PATENT DOCUMENTS

2011/0012604 A1    1/2011   Tsujiko et al.
2012/0105069 A1    5/2012   Wang et al.
(Continued)

FOREIGN PATENT DOCUMENTS

CN    101981750 A    2/2011
CN    102369627 A    3/2012
(Continued)

OTHER PUBLICATIONS

International Search Report for PCT/KR2020/012195 dated Dec. 18, 2020. 2 pgs.
(Continued)

*Primary Examiner* — Roy Y Yi
(74) *Attorney, Agent, or Firm* — Lerner David LLP (57) ABSTRACT

A battery management apparatus is configured to diagnose a state of a battery cell based on a capacity-voltage differential profile. Specifically, the battery management apparatus diagnoses a state of the battery cell according to a change pattern of a peak associated with a positive electrode reaction area and a peak associated with an available lithium loss in the capacity-voltage differential profile. The state of the battery cell may be diagnosed in real time even while the battery cell is in operation. In addition, it is possible to independently diagnose whether the positive electrode reaction area of the battery cell is reduced and whether available lithium is lost.

15 Claims, 5 Drawing Sheets

(51) Int. Cl.
*H01M 10/42* (2006.01)
*H01M 10/44* (2006.01)
*G01R 31/392* (2019.01)

(52) U.S. Cl.
CPC ............ *H01M 10/44* (2013.01); *G01R 31/392* (2019.01); *H01M 2010/4271* (2013.01)

(56) References Cited

U.S. PATENT DOCUMENTS

| | | |
|---|---|---|
| 2012/0169228 A1 | 7/2012 | Chuang et al. |
| 2012/0169288 A1 | 7/2012 | Ueki et al. |
| 2013/0119940 A1 | 5/2013 | Iriyama et al. |
| 2013/0335009 A1 | 12/2013 | Katsumata et al. |
| 2016/0061908 A1 | 3/2016 | Torai et al. |
| 2016/0195589 A1 | 7/2016 | Hanyu et al. |
| 2016/0204639 A1 | 7/2016 | Honkura et al. |
| 2017/0234930 A1 | 8/2017 | Lee et al. |
| 2019/0113577 A1 | 4/2019 | Severson et al. |

FOREIGN PATENT DOCUMENTS

| | | |
|---|---|---|
| CN | 102565710 A | 7/2012 |
| CN | 103513183 A | 1/2014 |
| CN | 105388422 A | 3/2016 |
| CN | 108896913 A | 11/2018 |
| CN | 109031153 A | 12/2018 |
| CN | 110058165 A | 7/2019 |
| JP | 5062295 B2 | 10/2012 |
| JP | 5625244 B2 | 11/2014 |
| JP | 5682955 B2 | 3/2015 |
| JP | 2016053564 A | 4/2016 |
| JP | 5940145 B2 | 6/2016 |
| JP | 2017059386 A | 3/2017 |
| JP | 2017129409 A | 7/2017 |
| JP | 2017133870 A | 8/2017 |
| JP | 6314043 B2 | 4/2018 |
| JP | 6323501 B2 | 5/2018 |
| JP | 2018205139 A | 12/2018 |
| KR | 20130142884 A | 12/2013 |
| KR | 20170023583 A | 3/2017 |
| WO | 2018122131 A1 | 7/2018 |

OTHER PUBLICATIONS

Weng Caihao et al., State-of-health monitoring of lithium-ion battery modules and packs via incremental capacity peak tracking, Applied Energy, Elsevier Science Publishers, GB, vol. 180, Aug. 4, 2016 (Aug. 4, 2016), pp. 360-368, XP029709869.

Wang Zhenpo et al: "State-of-Health Estimation for Lithium-Ion Batteries Based on the Multi-Island Genetic Algorithm and the Gaussian Process Regression", IEEE Access, IEEE, USA, vol. 5, Oct. 4, 2017 (Oct. 4, 2017), pp. 21286-21295, XP011672189.

Liang Tongyi et al: "On-board incremental capacity/differential voltage curves acquisition for state of health monitoring of lithium-ion batteries", 2018 IEEE International Conference on Applied System Invention (ICASI), IEEE, Apr. 13, 2018 (Apr. 13, 2018), pp. 976-979, XP033362823.

Hou Chaoyong et al: "An online calibration algorithm of SOC for LiFeP04 battery by using characteristic Curve", 2015 5th International Conference on Electric Utility Deregulation and Restructuring and Power Technologies (DRPT), IEEE, Nov. 26, 2015 (Nov. 26, 2015), pp. 2108-2112, XP032881004.

Christophersen J P et al: "Using radial basis functions to approximate battery differential capacity and differential voltage", Journal of Power Sources, Elsevier, Amsterdam, NL, vol. 195, No. 4, Feb. 15, 2010 (Feb. 15, 2010), pp. 1225-1234, XP026693557.

Petzl Mathias et al: "Advancements in OCV Measurement and Analysis for Lithium-Ion Batteries", IEEE Transactions on Energy Conversion, IEEE Service Center, Piscataway, NJ, US, vol. 28, No. 3, Sep. 1, 2013 (Sep. 1, 2013), pp. 675-681, XP011524193.

Li Jing et al: "Dependence of Cell Failure on Cut-Off Voltage Ranges and Observation of Kinetic Hindrance in LiNi 0.8 Co 0.15 Al 0.05 0 2", Journal of the Electrochemical Society, vol. 165, No. 11, Jan. 1, 2018 (Jan. 1, 2018), pp. A2682-A2695, XP055946764.

Matthieu Dubarry et al.: "Evaluation of commercial lithium-ion cells based on composite positive electrode for plug-in hybrid electric vehicle applications. Part I: Initial characterizations", Journal of Power Sources, Elsevier, Amsterdam, NL, vol. 196, No. 23, Aug. 18, 2011 (Aug. 18, 2011), pp. 10328-10335, XP028303471.

Han Xuebing et al: "A comparative study of commercial lithium ion battery cycle life in electrical vehicle: Aging mechanism identification", Journal of Power Sources, Elsevier, Amsterdam, NL, vol. 251, Nov. 23, 2013 (Nov. 23, 2013), pp. 38-54, XP028807460. [Abstract only].

Extended European Search Report for Application No. 20862658.0 dated Sep. 9, 2022. 12 pgs.

BATTERY MANAGEMENT APPARATUS AND METHOD

CROSS-REFERENCE TO RELATED APPLICATIONS

The present application is a national phase entry under 35 U.S.C. § 371 of International Application No. PCT/KR2020/012195 filed Sep. 9, 2020, published in Korean, which claims priority from Korean Patent Application No. 10-2019-0112936 filed Sep. 11, 2019, all of which are incorporated herein by reference.

TECHNICAL FIELD

The present application claims priority to Korean Patent Application No. 10-2019-0112936 filed on Sep. 11, 2019 in the Republic of Korea, the disclosures of which are incorporated herein by reference.

The present disclosure relates to a battery management apparatus and method, and more particularly, to a battery management apparatus and method for diagnosing a state of a battery cell based on a capacity-voltage differential profile and managing the battery cell.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

The battery cell may be degraded as charging or discharging is repeated. For example, at a positive electrode of the battery cell, the electrolyte may be oxidized or the crystal structure may be destroyed, resulting in degradation of the battery cell. At a negative electrode, metal lithium may precipitate to degrade the battery cell. In addition, generally, depending on the manufacturing conditions of a lithium ion secondary battery, the capacity of the secondary battery is degraded faster.

Therefore, in the related art, a technique for detecting an abnormality of a battery cell based on a capacity-voltage differential profile has been disclosed so as to secure long-term capacity reliability in the battery cell manufacturing step (Patent Document 1).

However, Patent Document 1 is directed to detecting the reliability of long-term capacity of the battery cell at the battery cell manufacturing stage, so there is a limitation in that the battery cell is charged only with the same charging current rate (C-rate).

For example, Patent Document 1 has a problem in that when the battery cell is charged at a charging C-rate different from a preset charging C-rate, it is impossible to diagnose the state of the battery cell. That is, Patent Document 1 cannot be used in a process where the battery cell is provided to a vehicle and is actually operated, and can be limitedly used only for test purposes during the battery cell manufacturing step.

(Patent Document 1) KR 10-2013-0142884 A

SUMMARY

Technical Problem

The present disclosure is designed to solve the problems of the related art, and therefore the present disclosure is directed to providing a battery management apparatus and method, which may diagnose a state of a battery cell in real time even during the operation of the battery cell based on a capacity-voltage differential profile.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect, the present disclosure may provide a battery management apparatus, comprising: a voltage sensor and a current sensor configured to measure a voltage and current of a battery cell, respectively, while the battery cell is being charged or discharged, for a plurality of charging and discharging cycles of the battery cell; a control unit configured to estimate, for each charging and discharging cycle, a capacity of the battery cell based on the measured current of the battery cell during the charging and discharging cycle; and memory configured to store: a respective capacity-voltage differential profile generated based on the measured voltage of the battery cell and the corresponding estimated capacity of the battery cell for each charging and discharging cycle; and a respective charging and discharging current rate (C-rate) for each charging and discharging cycle.

The control unit may be configured to generate a subset of the plurality of charging and discharging cycles having a common charging and discharging C-rate; and diagnose a state of the battery cell based on a comparison of capacity-voltage differential profiles of the subset of charging and discharging cycles with each other.

The control unit may be configured to estimate a new capacity of the battery cell based on the measured current of the battery cell during a new charging and discharging cycle, and generate a new capacity-voltage differential profile based on the measured voltage during the new charging and discharging cycle and the estimated new capacity.

The control unit may be configured to generate a plurality of subsets of charging and discharging cycles, select a predetermined subset from among the plurality of generated subsets, and diagnose a state of the battery cell based on a change pattern between the capacity-voltage differential profiles of the charging and discharging cycles of the selected predetermined subset and the new capacity-voltage differential profile.

The predetermined subset may be a subset of the plurality of charging and discharging cycles having a common charging and discharging C-rate equal to the charging and discharging C-rate of the new charging and discharging cycle.

The control unit may be configured to extract, for each capacity-voltage differential profile of subset of charging and discharging cycles, at least one of a first peak associated with loss of available lithium in the battery cell and a second peak associated with a positive electrode reaction area.

The control unit may be configured to diagnose the state of the battery cell based on a change pattern of at least one of the plurality of extracted first peaks and the plurality of extracted second peaks.

The control unit may be configured to diagnose the state of the battery cell as a state where the available lithium of the battery cell is lost, in response to a measured voltage of the plurality of first peaks increasing as the charging and discharging cycles progress.

The control unit may be configured to diagnose the state of the battery cell as a state where the positive electrode reaction area of the battery cell decreases, in response to a capacity change amount per unit voltage of the plurality of second peaks decreasing as the charging and discharging cycles progress.

The control unit may be configured to extract a plurality of peaks from each capacity-voltage differential profile, select, from among the plurality of extracted peaks, a reference peak satisfying a predetermined condition, and extract at least one of the first peak or the second peak based on the voltage and the capacity change amount per unit voltage of the selected reference peak.

The reference peak may be a peak at which a positive electrode peak and a negative electrode peak of the battery cell overlap.

The control unit may be configured to extract the first peak from among the plurality of extracted peaks, wherein a voltage of the first peak is lower than the voltage of the reference peak.

The capacity change amount per unit voltage of the first peak is closest, from among the plurality of peaks having a voltage less than the voltage of the reference peak, to the capacity change amount per unit voltage of the reference peak.

The control unit may be configured to extract the second peak from among the plurality of extracted peaks, wherein a voltage of the second peak is greater than the voltage of the reference peak.

The second peak may have a slope that changes from positive to negative and the corresponding voltage and is largest from among the plurality of extracted peaks having a voltage greater than the voltage of the reference peak.

The control unit may be configured to change at least one of a threshold value of the charging and discharging C-rate of the battery cell or an operational voltage range of the battery cell based on the diagnosed state of the battery cell.

In another aspect, the present disclosure may provide a battery pack, comprising the battery management apparatus according to any of the embodiments of the present disclosure.

In still another aspect, the present disclosure may provide a battery management method, comprising: measuring a voltage and current of a battery cell while the battery cell is being charged or discharged, for a plurality of charging and discharging cycles of the battery cell; estimating, for each charging and discharging cycle, a capacity of the battery cell based on the measured current of the battery cell during the charging and discharging cycle; generating a subset of the plurality of charging and discharging cycles having a common charging and discharging C-rate; and diagnosing a state of the battery cell based on a comparison of capacity-voltage differential profiles of the subset of charging and discharging cycles with each other.

Advantageous Effects

According to an aspect of the present disclosure, there is an advantage in that the state of the battery cell may be diagnosed in real time even while the battery cell is in operation.

In addition, there is an advantage in that it is possible to independently diagnose whether the positive electrode reaction area of the battery cell is reduced and whether available lithium is lost.

In addition, since the state of the battery cell is diagnosed by a peak selected in consideration of the voltage-capacity profile and the capacity-voltage differential profile of the battery cell, the accuracy and reliability of diagnosis on the state of the battery cell may be improved.

In addition, as the capacity-voltage differential profile of the battery cell is accumulated, the accuracy and reliability of diagnosis on the state of the battery cell may be improved.

The effects of the present disclosure are not limited to the effects mentioned above, and other effects not mentioned will be clearly understood by those skilled in the art from the description of the claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
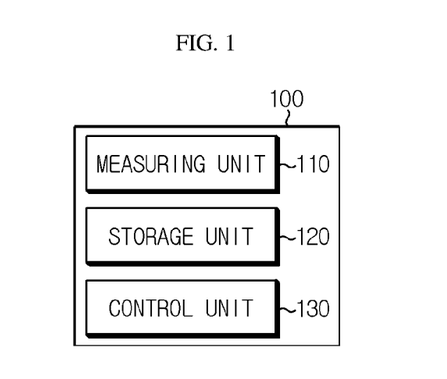
FIG. 1 is a diagram schematically showing a battery management apparatus according to an embodiment of the present disclosure.
Figure 2:
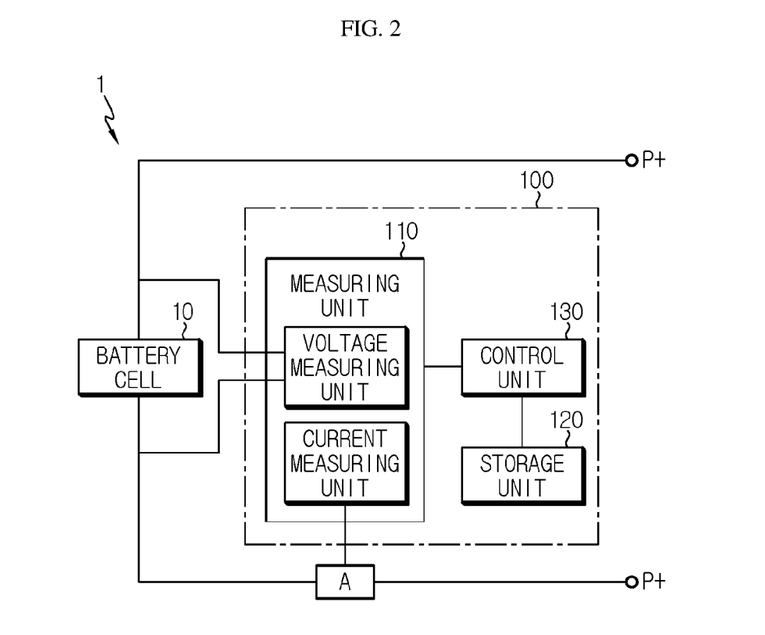
FIG. 2 is a diagram exemplarily showing a configuration of a battery pack including the battery management apparatus according to an embodiment of the present disclosure.

FIG. 1 is a diagram schematically showing a battery management apparatus 100 according to an embodiment of the present disclosure. FIG. 2 is a diagram exemplarily showing a configuration of a battery pack 1 including the battery management apparatus 100 according to an embodiment of the present disclosure.

Referring to FIG. 1, the battery management apparatus 100 according to an embodiment of the present disclosure may include a measuring unit 110, a storage unit 120, and a control unit 130.

In addition, referring to FIG. 2, the battery management apparatus 100 may be provided inside a battery pack 1 and connected to a battery cell 10. FIG. 2 shows an example in which a single battery cell 10 is provided in the battery pack 1, but the battery pack 1 may include a battery module in which one or more battery cells 10 are connected in series and/or in parallel. In this case, the battery management apparatus 100 may be connected to the battery module and each of the plurality of battery cells 10 included in the battery module.

The measuring unit 110 and the storage unit 120 included in the battery management apparatus 100 may be respectively connected to the control unit 130 to communicate therewith. For example, the measuring unit 110 may transmit a measurement result about the battery cell 10 to the control unit 130. In addition, the control unit 130 may extract data stored in the storage unit 120 and store new data in the storage unit 120.

Hereinafter, each component of the battery management apparatus 100 will be described in detail.

The measuring unit 110 may be configured to measure a voltage and current of the battery cell 10 while the battery cell 10 is being charged or discharged, in a charging and discharging cycle of the battery cell 10.

Referring to FIG. 2, the measuring unit 110 may include a voltage measuring unit for measuring a voltage of the battery cell 10 and a current measuring unit for measuring a charging and discharging current of the battery cell 10.

The voltage measuring unit may measure the voltage of the battery cell 10 by measuring a positive electrode potential and a negative electrode potential of the battery cell 10 and obtaining a difference between the measured positive electrode potential and the measured negative electrode potential.

The current measuring unit may measure the charging and discharging current of the battery cell 10 by means of a voltmeter A provided on a charging and discharging path of the battery cell 10.

The measuring unit 110 may convert information on the measured voltage and current of the battery cell 10 into a signal and transmit the signal to the control unit 130.

The control unit 130 may be configured to estimate a capacity of the battery cell 10 based on the current of the battery cell 10 measured by the measuring unit 110. Here, the capacity of the battery cell 10 may be a state of charge (SOC) of the battery cell 10.

For example, the control unit 130 may estimate the capacity of the battery cell 10 by integrating the amount of charging current measured through the current measuring unit while the battery cell 10 is being charged. In addition, the control unit 130 may estimate the capacity of the battery cell 10 by integrating the amount of discharging current measured through the current measuring unit while the battery cell 10 is being discharged.

That is, the control unit 130 may estimate the capacity of the battery cell 10 using an Ampere counting method.

The storage unit 120 may be configured to store a capacity-voltage differential profile generated based on the voltage of the battery cell 10 measured by the measuring unit 110 and the capacity of the battery cell 10 estimated by the control unit 130, and a charging and discharging C-rate of each charging and discharging cycle.

That is, the storage unit 120 may be configured to store the capacity-voltage differential profile of the battery cell 10 and the current rate (C-rate) information of each charging and discharging cycle.

Here, the capacity-voltage differential profile is a profile obtained by differentiate the capacity-voltage profile of the battery cell 10 with respect to voltage, and may be a profile of a capacity change amount per unit voltage with respect to the voltage of the battery cell 10.

For example, the storage unit 120 may store the capacity-voltage differential profile in the form of a table in which a capacity change amount per unit voltage is recorded for each voltage of the battery cell 10. Alternatively, the storage unit 120 may store the capacity-voltage differential profile in the form of a graph recorded at coordinates where the X-axis is the voltage of the battery cell 10 and the Y-axis is the capacity change amount per unit voltage of the battery cell 10.

In addition, the storage unit 120 may store the charging and discharging C-rate in each charging and discharging cycle of the battery cell 10. That is, the storage unit 120 may store the charging and discharging C-rate and the capacity-voltage differential profile to be matched for each charging and discharging cycle of the battery cell 10.

For example, the storage unit 120 may store the charging and discharging C-rate and the capacity-voltage differential profile in each charging and discharging cycle of the battery cell 10. Preferably, the storage unit 120 may store the charging C-rate and the capacity-voltage differential profile in the first charging cycle of the battery cell 10, and store the discharging C-rate and the capacity-voltage differential profile in the first discharging cycle.

An example of the capacity-voltage differential profile will be described with reference to FIG. 3.

Figure 3:
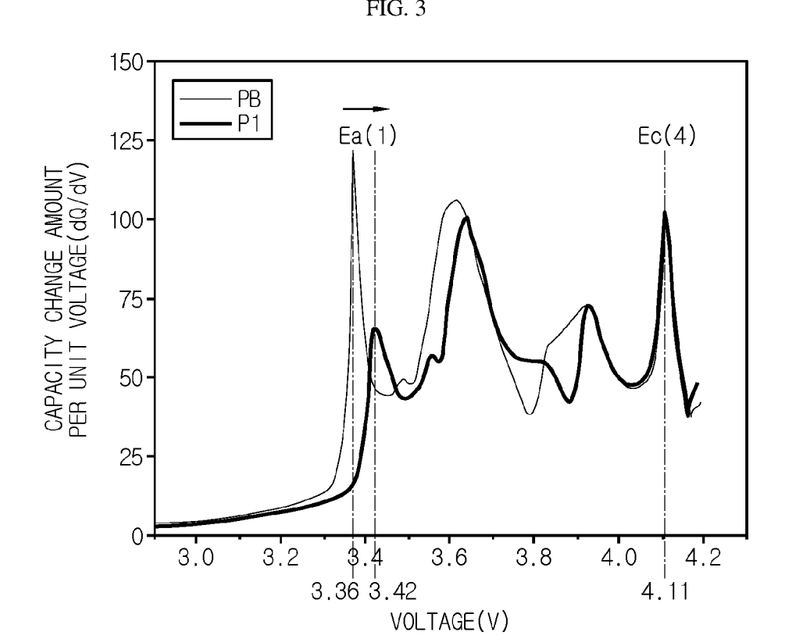
FIG. 3 is a diagram schematically showing a first capacity-voltage differential profile generated by the battery management apparatus according to an embodiment of the present disclosure.

FIG. 3 is a diagram schematically showing a first capacity-voltage differential profile P1 generated by the battery management apparatus 100 according to an embodiment of the present disclosure.

For convenience of explanation, it should be noted that a first capacity-voltage differential profile P1 shown in FIG. 3 is generated based on the voltage of the battery cell 10 measured in a charging cycle of the battery cell 10 and the estimated capacity of the battery cell 10. That is, the control unit 130 may generate the capacity-voltage differential profile in the charging cycle and/or in the discharging cycle of the battery cell 10.

Hereinafter, for convenience of explanation, it will be described that the charging and discharging cycle refers to a charging cycle and/or a discharging cycle, and the charging and discharging C-rate refers to a charging C-rate and/or a discharging C-rate.

Specifically, FIG. 3 shows a reference profile PB generated when the battery cell 10 is in a BOF (Beginning of Life) state and a first capacity-voltage differential profile P1 of a battery cell 10 that is degraded, together on a two-dimensional coordinate plane.

That is, the capacity-voltage differential profile is a profile associated with the capacity change amount per unit voltage for the voltage of the battery cell 10, and may be stored in the storage unit 120 in the form of a graph as shown in FIG. 3, or in the form of a table in which the voltage value and the capacity change amount per unit voltage are recorded.

The control unit 130 may generate a group of charging and discharging cycles having the same charging and discharging C-rate stored in the storage unit 120.

In the storage unit 120, the charging and discharging C-rate and the capacity-voltage differential profile may be stored to be matched for each charging and discharging cycle. The control unit 130 may generate a group of charging and discharging cycles having the same C-rate. In addition, the control unit 130 may store information on the generated group in the storage unit 120. That is, the storage unit 120 stores group information for each charging and discharging C-rate, and the group information may include charging and discharging cycle information.

Preferably, the control unit 130 may generate a group of cycles having the same C-rate, among the charging and discharging cycles stored in the storage unit 120.

For example, it is assumed that the charging C-rate of the first charging cycle, the 100$^{th}$ charging cycle and the 200$^{th}$ charging cycle is 0.33 C, and the charging C-rate of the 50$^{th}$ charging cycle, the 150$^{th}$ charging cycle and the 250$^{th}$ charging cycle is 0.05 C. The control unit 130 may make one group using the first charging cycle, the 100$^{th}$ charging cycle and the 200$^{th}$ charging cycle having the same charging C-rate. In addition, the control unit 130 may make one group using the 50$^{th}$ charging cycle, the 150$^{th}$ charging cycle and the 250$^{th}$ charging cycle. That is, the generated group may include information on the charging cycle in which charging is performed with the same charging C-rate.

In FIG. 3, reference profile PB and the first capacity-voltage differential profile P1 may be generated based on the voltage of the battery cell 10 measured in the charging cycles charged with the same charging C-rate and the estimated capacity of the battery cell 10.

In addition, the control unit 130 may be configured to diagnose a state of the battery cell 10 by comparing each of the capacity-voltage differential profiles corresponding to the charging and discharging cycles included in the same group.

Preferably, the control unit 130 may improve the accuracy and reliability of diagnosis on the state of the battery cell 10 by comparing the capacity-voltage differential profiles corresponding to the cycles charged with the same C-rate or the cycles discharged with the same C-rate.

For example, if the battery cell 10 is charged or discharged at a low C-rate (for example, at a C-rate of 0.1 C or less), charging or discharging takes a long time, but the peak of the obtained capacity-voltage differential profile for diagnosing the state of the battery cell 10 may be shown more clearly. However, if the battery cell 10 is provided to a device that receives power from the battery cell 10, like a vehicle, there is a problem in that the battery cell 10 is not able to be charged or discharged at a low C-rate in the process of driving the device.

Conversely, the battery cell 10 is charged or discharged at a high C-rate (for example, at a C-rate exceeding 0.1 C), charging or discharging time is shortened, but the peak of the obtained capacity-voltage differential profile for diagnosing the state of the battery cell 10 may be shown more unclearly, compared to the case of low-rate charging and discharging. That is, if the state of the battery cell 10 is diagnosed by comparing the capacity-voltage differential profiles in a plurality of charging cycles charged with different charging C-rates, the accuracy and reliability of the diagnosis result on the battery cell 10 are inevitably lowered.

Therefore, the battery management apparatus 100 according to an embodiment of the present disclosure has an advantage of more accurately diagnosing the state of the battery cell 10 by comparing capacity-voltage differential profiles corresponding to cycles charged and discharged with the same C-rate.

Here, the control unit 130 provided to the battery management apparatus 100 may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit 130 may be implemented as a set of program modules. At this time, the program module may be stored in a memory and executed by a processor. The memory may be located inside or out of the processor and may be connected to the processor by various well-known means.

In addition, the storage unit 120 may store programs and data necessary for the control unit 130 to diagnose a state of the battery cell 10. That is, the storage unit 120 may store data necessary for operation and function of each component of the battery management apparatus 100 according to an embodiment of the present disclosure, such as the neural network and the battery model, data generated in the process of performing the operation or function, or the like. The storage unit 120 is not particularly limited in its kind as long as it is a known information storage means that can record, erase, update and read data. As an example, the information storage means may include random access memory (RAM), flash memory, read-only memory (ROM), electrically erasable programmable read-only memory (EEPROM), registers, and the like. In addition, the storage unit 120 may store program codes in which processes executable by the control unit 130 are defined.

The control unit 130 may be configured to estimate a capacity of the battery cell 10 based on the current of the battery cell 10 measured by the measuring unit 110 during a new charging and discharging cycle.

That is, when the battery cell 10 is in a new charging and discharging cycle, the control unit 130 may estimate the capacity of the battery cell 10 in real time based on the current of the battery cell 10 measured by the current measuring unit.

In addition, the control unit 130 may be configured to generate a new capacity-voltage differential profile based on the voltage measured by the measuring unit 110 and the estimated capacity.

That is, during the new charging and discharging cycle, the voltage measuring unit may measure the voltage of the battery cell 10, and the control unit 130 may estimate the capacity of the battery cell 10.

The control unit 130 may generate a new capacity-voltage differential profile during the new charging and discharging cycle based on the measured voltage of the battery cell 10 and the estimated capacity of the battery cell 10. In addition, the control unit 130 may store the generated new capacity-voltage differential profile in the storage unit 120.

In addition, the control unit 130 may be configured to select a predetermined group among the generated groups, and diagnose the state of the battery cell 10 according to a change pattern between the capacity-voltage differential profile corresponding to the charging and discharging cycle of the selected predetermined group and the new capacity-voltage differential profile.

Preferably, the control unit 130 may identify the change pattern between the capacity-voltage differential profile corresponding to the predetermined group among the groups generated according to the charging and discharging C-rate and the new capacity-voltage differential profile, and diagnose the state of the battery cell 10 according to the identified change pattern.

Therefore, the control unit 130 may diagnose the state of the battery cell 10 based on the new capacity-voltage differential profile generated while the battery cell 10 is in operation as well as the capacity-voltage differential profile stored in advance to diagnose the state of the battery cell 10.

That is, the control unit 130 may diagnose the state of the battery cell 10 in real time.

For example, it is assumed that the battery cell 10 and the battery management apparatus 100 are provided in a vehicle, the vehicle is currently running, and the battery cell 10 is being charged. For convenience of explanation, it is assumed that one battery cell 10 is included in the vehicle. The measuring unit 110 may measure the voltage and current of the battery cell 10, and the control unit 130 may estimate the capacity of the battery cell 10. In addition, the control unit 130 may generate a new voltage-capacity differential profile based on the voltage and capacity of the battery cell 10. In addition, the control unit 130 may select a predetermined group among the generated groups, and compare the capacity-voltage differential profile corresponding to the charging cycle of the selected predetermined group with the generated new voltage-capacity differential profile. Therefore, the control unit 130 may diagnose the state of the battery cell 10 even while the vehicle is running.

That is, the battery management apparatus 100 according to an embodiment of the present disclosure has an advantage of diagnosing the state of the battery cell 10 in real time even while the battery cell 10 is in use.

Preferably, the predetermined group may be a group of cycles having the same charging and discharging C-rate as the charging and discharging C-rate of the new charging and discharging cycle, among the generated groups.

Specifically, the control unit 130 may select a group of cycles having the same C-rate as the charging and discharging C-rate of the new charging and discharging cycle, among the generated groups. Here, the selected group may be the predetermined group.

The control unit 130 may diagnose the state of the battery cell 10 by comparing the capacity-voltage differential profile included in the selected predetermined group with the new capacity-voltage differential profile.

That is, the control unit 130 may diagnose the state of the battery cell 10 by comparing the capacity-voltage differential profiles generated when being charged or discharged with the same C-rate. In this case, the accuracy and reliability of diagnosis on the state of the battery cell 10 may be improved, compared to the case where the state of the battery cell 10 is diagnosed by comparing the capacity-voltage differential profiles generated when being charged or discharged with different charging and discharging C-rates.

For example, as in the above example, it is assumed that the battery cell 10 and the battery management apparatus 100 are provided in a vehicle, the vehicle is currently running, and the battery cell 10 is being charged. The control unit 130 may select a group of cycles having the same charging C-rate as the C-rate of the new charging cycle, among the generated groups. That is, the charging cycle of the selected group and the new charging cycle may have the same charging C-rate. The control unit 130 may diagnose the state of the battery cell 10 by comparing the capacity-voltage differential profile corresponding to the charging cycle of the selected group with the new capacity-voltage differential profile.

That is, the battery management apparatus 100 according to an embodiment of the present disclosure has an advantage of improving the accuracy and reliability of diagnosis on the state of the battery cell 10 by comparing the voltage-capacity differential profiles at the same C-rate, even if the battery cell 10 is charged or discharged at different C-rates depending on situations.

The control unit 130 may be configured to extract at least one of a first peak associated with loss of available lithium of a negative electrode provided to the battery cell 10 and a second peak associated with a positive electrode reaction area, in each capacity-voltage differential profile corresponding to the charging and discharging cycles included in the same group.

For example, the control unit 130 may diagnose whether the positive electrode reaction area is decreased based on the peak at a positive electrode of the battery cell 10 in the capacity-voltage differential profile. In addition, the control unit 130 may diagnose the loss of available lithium based on the peak at the negative electrode of the battery cell 10 in the capacity-voltage differential profile. That is, the control unit 130 may diagnose whether lithium plating (Li-plating) occurs due to the loss of available lithium, based on the peak at the negative electrode of the battery cell 10 in the capacity-voltage differential profile. Here, the peak at the negative electrode for determining whether available lithium is lost is the first peak. Also, the peak at the positive electrode for determining whether the reaction area of the positive electrode is decreased is the second peak.

The control unit 130 may be configured to diagnose the state of the battery cell 10 according to a change pattern of at least one of the plurality of extracted first peaks and the plurality of extracted second peaks.

For example, the control unit 130 may diagnose whether available lithium is lost based on the first peak or may diagnose whether the positive electrode reaction area is decreased based on the second peak. In addition, the control unit 130 may diagnose both the loss of available lithium of the battery cell 10 and the decrease in the positive electrode reaction area by considering both the first peak and the second peak.

That is, the battery management apparatus 100 according to an embodiment of the present disclosure may diagnose the state of the battery cell 10 by considering the peak at the negative electrode and the peak at the positive electrode of the battery cell 10, respectively. Therefore, since the state of the positive electrode and the state of the negative electrode of the battery cell 10 are independently diagnosed, the state of the battery cell 10 may be diagnosed more specifically and accurately.

If the voltage of the plurality of first peaks is moved toward a high potential as the charging and discharging cycles progress, the control unit 130 may be configured to diagnose the state of the battery cell 10 as a state where the available lithium of the battery cell 10 is lost.

For example, in the capacity-voltage differential profile corresponding to each charging and discharging cycle, if the voltage of the first peak moves toward a high potential as the charging and discharging cycles progress, this may be the case where lithium plating is generated as solid lithium is precipitated on the negative electrode of the battery cell 10.

That is, since lithium plating is generated to form a metal lithium plating film on the surface of the negative electrode, the available capacity of the battery cell 10 may be reduced even at the same voltage as the battery cell 10 in an initial state. Therefore, as available lithium is lost more, the voltage of the first peak may be moved toward a high potential.

Specifically, if the metal lithium plating film is formed on the surface of the negative electrode, the reaction area on the surface of the negative electrode decreases and the available lithium decreases, so the voltage behavior of a negative electrode half cell may be changed. Meanwhile, even if lithium plating is generated, the voltage behavior of a positive electrode half cell is relatively unchanged, so the voltage of the first peak of a full cell may be moved toward a high potential.

Based on this point, if the voltage of the first peak moves toward a high potential as the charging and discharging cycles progress, the control unit 130 may diagnose that available lithium is lost.

For example, referring to FIG. 3, the first peak of the reference profile PB is located at about 3.36V, and the first peak of the first capacity-voltage differential profile P1 is located at about 3.42V. This may mean that, in the charging cycle corresponding to the first capacity-voltage differential profile P1, available lithium of the battery cell 10 is reduced compared to the initial state. Accordingly, the control unit 130 may diagnose that the available lithium of the battery cell 10 is lost because the voltage of the first peak of the first capacity-voltage differential profile P1 is moved toward a high potential, compared to the voltage of the first peak of the reference profile PB.

In addition, lithium plating means precipitation of lithium metal, and since lithium metal reacts violently with water, there is a possibility that the battery cell 10 explodes. That is, the occurrence of lithium plating may cause a big problem not only in the battery cell 10 but also in the battery pack 1 including the battery cell 10.

Therefore, the battery management apparatus 100 according to an embodiment of the present disclosure may quickly and accurately diagnose the state of the battery cell 10 by checking whether there is a loss of available lithium in the battery cell 10 in real time based on the first peak of the capacity-voltage differential profile. In addition, the battery management apparatus 100 has an advantage of preventing unexpected accidents caused by the occurrence of lithium plating in advance by quickly diagnosing whether lithium plating is generated in the battery cell 10.

If the capacity change amount per unit voltage of the plurality of second peaks decreases as the charging and discharging cycles progress, the control unit 130 may be configured to diagnose the state of the battery cell 10 as a state where the positive electrode reaction area of the battery cell 10 is reduced.

In the capacity-voltage differential profile corresponding to each charging and discharging cycle, if the capacity change amount per unit voltage of the second peak decreases as the charging and discharging cycles progress, this may be a case where the available reaction area on the positive electrode of the battery cell 10 is reduced due to a side reaction or the like. For example, the positive electrode reaction area may be reduced due to degradation of the positive electrode active material or increase of particle film resistance. In addition, the positive electrode reaction area may also be reduced due to pore clogging or contact loss.

If the positive electrode reaction area is reduced, the output of the battery cell 10 may be reduced because the reaction area between the surface of the positive electrode active material and the electrolyte decreases. That is, as he positive electrode reaction area decreases, the capacity change amount per unit voltage of the battery cell 10 may decrease. Accordingly, the control unit 130 may diagnose whether the positive electrode reaction area of the battery cell 10 is decreased according to the change pattern of the second peak of the capacity-voltage differential profile.

Figure 4:
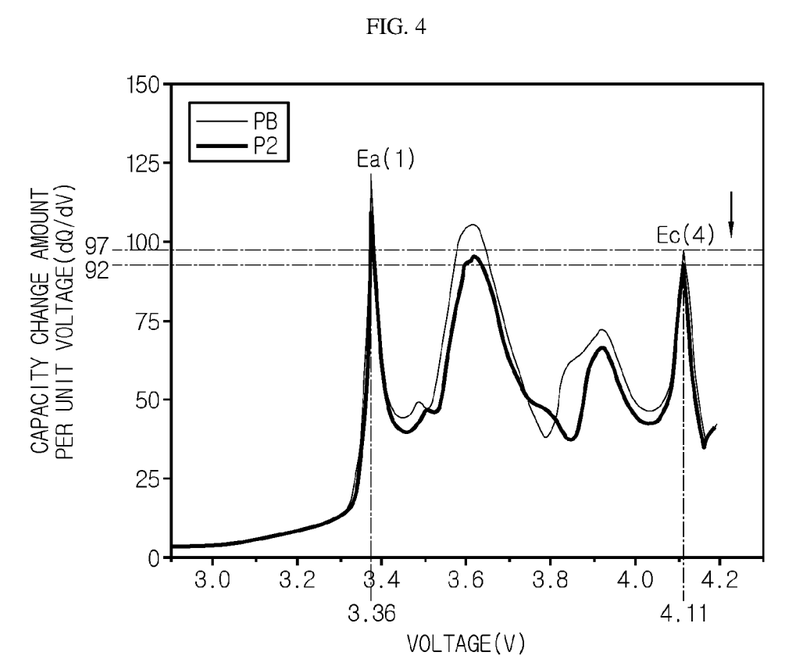
FIG. 4 is a diagram schematically showing a second capacity-voltage differential profile generated by the battery management apparatus according to an embodiment of the present disclosure.

FIG. 4 is a diagram schematically showing a second capacity-voltage differential profile P2 generated by the battery management apparatus 100 according to an embodiment of the present disclosure.

For convenience of explanation, it should be noted that the second capacity-voltage differential profile P2 shown in FIG. 4 is generated based on the voltage of the battery cell 10 measured in the charging cycle of the battery cell 10 and the estimated capacity of the battery cell 10, similar to the first capacity-voltage differential profile P1.

Specifically, FIG. 4 is a diagram in which the reference profile PB generated when the battery cell 10 is in a Beginning of Life (BOF) state and the second capacity-voltage differential profile P2 generated after several charging and discharging cycles are shown together on a two-dimensional coordinate plane.

That is, the capacity-voltage differential profile is a profile associated with the capacity change amount per unit voltage on the voltage of the battery cell 10, and may be stored in the storage unit 120 in the form of a graph as shown in FIG. 4, or in the form of a table in which the voltage value and the capacity change amount per unit voltage are recorded.

Referring to FIG. 4, the second peak of the reference profile PB and the second capacity-voltage differential profile P2 is located at about 4.11V. However, the capacity change amount per unit voltage of the second peak of the reference profile PB is 97, while the capacity change amount per unit voltage of the second peak of the second capacity-voltage differential profile P2 is 92. That is, the capacity change amount per unit voltage of the second peak of the second capacity-voltage differential profile is decreased compared to the capacity change amount per unit voltage of the second peak of the reference profile PB. As described above, if the capacity change amount per unit voltage decreases, namely if the output of the battery cell 10 decreases, this means that the positive electrode reaction area of the battery cell 10 decreases. Therefore, the control unit 130 may diagnose the state of the battery cell 10 as a state where the positive electrode reaction area is reduced.

The battery management apparatus 100 according to an embodiment of the present disclosure may quickly and accurately diagnose the state of the battery cell 10 by checking whether the positive electrode reaction area of the battery cell 10 is reduced in real time based on the second peak of the capacity-voltage differential profile.

The control unit 130 may be configured to extract a plurality of peaks from each capacity-voltage differential profile.

Here, the peak is a point corresponding to an inflection point in the capacity-voltage profile. That is, the peak may be a point where the slope changes from positive to negative in the capacity-voltage differential profile, or may be a point where the slope changes from negative to positive. For example, at the plurality of peaks, an instantaneous slope of the capacity-voltage differential profile may be 0.

The control unit 130 may be configured to select a reference peak (Ref P) that satisfies a predetermined condition, among the plurality of extracted peaks.

In general, a plurality of peaks may be extracted from the capacity-voltage differential profile of the battery cell 10. For example, referring to FIGS. 3 and 4, a plurality of peaks may exist in each capacity-voltage differential profile.

The control unit 130 may select a reference peak (Ref P) that satisfies a predetermined condition, among the plurality of extracted peaks.

For example, in all of the reference profile PB, the first capacity-voltage differential profile P1 and the second capacity-voltage differential profile P2 shown in FIGS. 3 and 4, reference peaks (Ref P) may be located at about 3.6V points.

In addition, the control unit 130 may be configured to extract at least one of the first peak (Ea (1)) and the second peak (Ec (4)) based on the voltage of the selected reference peak (Ref P) and the capacity change amount per unit voltage.

That is, the control unit 130 may select the reference peak (Ref P) among the plurality of peaks included in the capacity-voltage differential profile, and then extract at least one of the first peak (Ea (1)) and second peak (Ec (4)) based on the voltage of the reference peak (Ref P) and the capacity change amount per unit voltage. Since the reference peak (Ref P) is always selected in the battery cell 10 including a negative electrode and a positive electrode, the control unit 130 may improve the accuracy and reliability in selecting the first peak (Ea (1)) and the second peak (Ec (4)) by using the reference peak (Ref P).

Therefore, the battery management apparatus 100 according to an embodiment of the present disclosure has an advantage of more accurately diagnosing the state of the battery cell 10 based on the first peak (Ea (1)) and/or the second peak (Ec (4)) selected based on the reference peak (Ref P).

Preferably, the reference peak (Ref P) may be a peak at which the positive electrode peak and the negative electrode peak of the battery cell 10 are mixed and overlapped in the capacity-voltage differential profile.

The control unit 130 may select the first peak (Ea (1)) and the second peak (Ec (4)) based on the reference peak (Ref P). That is, the control unit 130 may diagnose the loss of available lithium in the battery cell 10 based on the first peak (Ea (1)), which is a peak of the negative electrode of the battery cell 10, and diagnose whether the positive electrode reaction area of the battery cell 10 is reduced based on the second peak (Ec (4)), which is a peak of the positive electrode of the battery cell 10.

For example, the reference peaks (Ref P) in the reference profile PB, the first capacity-voltage differential profile P1 and the second capacity-voltage differential profile P2 shown in FIGS. 3 and 4 may all be peaks located at about 3.6V point.

Specifically, the reference peak (Ref P) may be selected based on the voltage-capacity profile and the capacity-voltage differential profile of the battery cell 10. Here, the voltage-capacity profile is a voltage profile about capacity, which may be shown on a coordinate plane in which the X-axis is capacity and the Y-axis is voltage. That is, the voltage-capacity profile and the capacity-voltage profile may be symmetrical to each other.

Figure 5:
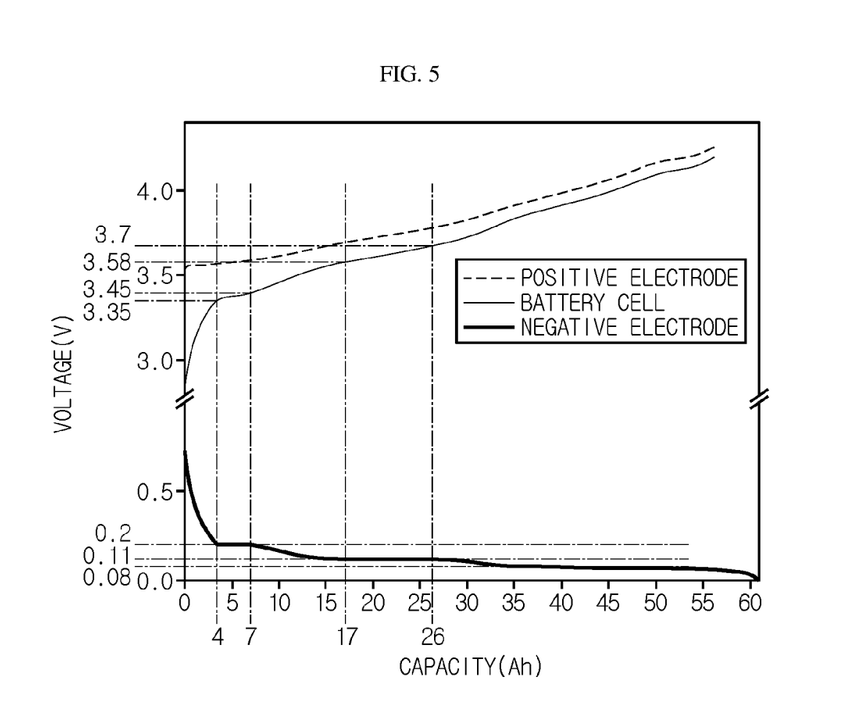
FIG. 5 is a diagram schematically showing a voltage-capacity profile generated by the battery management apparatus according to an embodiment of the present disclosure.

FIG. 5 is a diagram schematically showing a voltage-capacity profile generated by the battery management apparatus 100 according to an embodiment of the present disclosure. Specifically, FIG. 5 is a diagram schematically showing a voltage-capacity profile of the battery cell 10 in a charging cycle.

The control unit 130 may identify a plurality of flat portions in the voltage-capacity profile of the battery cell 10. In addition, the control unit may select at least one flat portion among the plurality of identified flat portions. Here, the flat portion may mean a certain section in which voltage is constant. That is, the flat portion may be regarded to mean a section in which the voltage is constant or the voltage change is less than a predetermined level even though the capacity increases.

Referring to FIG. 5, the control unit 130 may determine that a plurality of flat portions are formed at 0.2V, 0.11V and 0.08V of the voltage-capacity profile for the negative electrode of the battery cell 10. In addition, the control unit 130 may select a capacity section of the flat portion where the corresponding voltage has a second largest magnitude, among the plurality of selected flat portions. The selected capacity section may be 17 Ah to 26 Ah.

The control unit 130 may identify a voltage section of the battery cell 10 corresponding to the selected capacity section. Referring to FIG. 5, the voltage section of the battery cell 10 corresponding to the selected capacity section 17 Ah to 26 Ah may be 3.58V to 3.7V.

Finally, the control unit 130 may select a peak included in the selected voltage section among the plurality of peaks included in the capacity-voltage differential profile as the reference peak (Ref P). For example, referring to FIGS. 3 and 4, one peak may be included in the voltage section 3.58V to 3.7V among the plurality of peaks included in the capacity-voltage differential profile. The control unit 130 may select the peak included in the voltage section as the reference peak (Ref P).

In other words, the battery management apparatus according to an embodiment of the present disclosure may improve the accuracy of selecting the first peak (Ea (1)) and the second peak (Ec (4)) by selecting a peak at which the positive electrode peak and the negative electrode peak are mixed as the reference peak (Ref P).

The control unit 130 may be configured to select the first peak (Ea (1)) in a lower potential section compared to the voltage of the reference peak among the plurality of extracted peaks.

Referring to FIGS. 3 and 4, a plurality of peaks may be included in a low potential section compared to the voltage of the reference peak (Ref P). The control unit 130 may select the first peak (Ea (1)) associated with an available lithium loss among the plurality of peaks included in the low potential section.

For example, referring to FIG. 3, the first peak (Ea (1)) in the first capacity-voltage differential profile P1 is a peak at a voltage of 3.42V. In addition, referring to FIG. 4, the first peak (Ea (1)) in the second capacity-voltage differential profile P2 is a peak at a voltage of 3.36V.

The control unit 130 may extract the first peak (Ea (1)) from each capacity-voltage differential profile generated at every charging and discharging cycle. In addition, the control unit 130 may diagnose whether the available lithium capacity of the battery cell 10 is lost according to whether the voltage of the extracted first peak (Ea (1)) moves toward a high potential side as the charging and discharging cycles progress.

For example, the control unit 130 may be configured to select a peak having a capacity change amount per unit voltage, which is closest to the capacity change amount per unit voltage of the reference peak (Ref P), in the low potential section among the plurality of extracted peaks, as the first peak (Ea (1)).

That is, referring to FIG. 3, in the first capacity-voltage differential profile P1, the reference peak (Ref P) is a peak at a voltage of about 3.6V. The control unit 130 may select a peak having a capacity change amount per unit voltage, which is closest to the capacity change amount per unit voltage of the reference peak (Ref P), at a voltage of less than 3.6V as the peak (Ea (1)).

As another example, the control unit 130 may select a capacity section of a flat portion where the corresponding voltage is largest, among the plurality of flat portions selected in the voltage-capacity profile for the negative electrode of the battery cell 10. Referring to FIG. 5, the selected capacity section may be 4 Ah to 7 Ah.

The control unit 130 may select a voltage section of the battery cell 10 corresponding to the selected capacity section. Referring to FIG. 5, the voltage section of the battery cell 10 corresponding to the selected capacity sections 4 Ah to 7 Ah may be 3.35V to 3.45V.

Finally, the control unit 130 may select a peak included in the selected voltage section among the plurality of peaks included in the capacity-voltage differential profile as the first peak (Ea (1)). For example, referring to FIGS. 3 and 4, one peak may be included in the voltage section 3.35V to 3.45V among the plurality of peaks included in the capacity-voltage differential profile. The control unit 130 may select the peak included in the voltage section as the first peak (Ea (1)).

As such, the battery management apparatus 100 according to an embodiment of the present disclosure has an advantage in that a peak may be selected according to a clearer standard by selecting the reference peak (Ref P) and the first peak (Ea (1)) using the voltage-capacity profile and the capacity-voltage differential profile. In addition, through this, the state of the battery cell 10 may be more accurately diagnosed.

The control unit 130 may be configured to select the second peak (Ec (4)) in a potential section compared to the voltage of the reference peak among the plurality of extracted peaks.

Referring to FIGS. 3 and 4, a plurality of peaks may be included in a high potential section compared to the voltage of the reference peak (Ref P). The control unit 130 may select the second peak (Ec (4)) associated with loss of the positive electrode reaction area among the plurality of peaks included in the high potential section.

For example, referring to FIG. 3, the second peak (Ec (4)) in the first capacity-voltage differential profile P1 is a peak at a voltage of 4.11V. In addition, referring to FIG. 4, the second peak (Ec (4)) in the second capacity-voltage differential profile P2 is a peak at a voltage of 4.11V. That is, the second peak (Ec (4)) is a peak located near the charging terminal close to about 4.1V in the capacity-voltage differential profile.

The control unit 130 may extract the second peak (Ec (4)) from each capacity-voltage differential profile generated in every charging and discharging cycle. In addition, the control unit 130 may diagnose whether the positive electrode reaction area of the battery cell 10 is lost according to whether the capacity change amount per unit voltage of the extracted second peak decreases as the charging and discharging cycles progress.

For example, referring to FIG. 3, the second peaks (Ec (4)) of the reference profile PB and the first capacity-voltage differential profile P1 are identical in terms of the voltage and the capacity change amount per unit voltage. That is, the second peak in the reference profile PB and the second peak in the first capacity-voltage differential profile P1 are identical in terms of the voltage and the capacity change amount per unit voltage. It may be found that the positive electrode reaction area of the battery cell 10 is not reduced but maintained as in the initial state. Accordingly, the control unit 130 may diagnose that the positive electrode reaction area of the battery cell 10 of FIG. 3 is not reduced.

As another example, referring to FIG. 4, the second peaks (Ec (4)) of the reference profile PB and the second capacity-voltage differential profile P2 have the same voltage, but have different capacity change amounts per unit voltage. That is, the capacity change amount per unit voltage of the second peak (Ec (4)) in the reference profile PB is greater than the capacity change amount per unit voltage of the second peak (Ec (4)) in the second capacity-voltage differential profile P2.

Specifically, the capacity change amount per unit voltage of the second peak (Ec (4)) in the reference profile PB is 97, while the capacity change amount per unit voltage of the second peak (Ec (4)) in the second capacity-voltage differential profile P2 is 92. That is, as the battery cell 10 is used, the capacity change amount per unit voltage of the second peak (Ec (4)) decreases by 5, which may be considered a case where the positive electrode reaction area of the battery cell 10 decreases. Accordingly, the control unit 130 may diagnose that the positive electrode reaction area of the battery cell 10 of FIG. 4 is reduced.

The battery management apparatus 100 according to an embodiment of the present disclosure may independently diagnose whether the positive electrode reaction area of the battery cell 10 is lost, based on a change pattern of the peak located in a high potential section (the positive electrode section) rather than the reference peak (Ref P) in the capacity-voltage differential profile. Therefore, it is possible to more accurately diagnose whether the positive electrode reaction area of the battery cell 10 is decreased due to a side reaction or the like.

The control unit 130 may be configured to select a peak at which a slope changes from positive to negative and the corresponding voltage is largest as the second peak (Ec (4)), among the plurality of peaks included in the high potential section.

Specifically, the second peak (Ec (4)) is included in a high potential section compared to the reference peak (Ref P) of the capacity-voltage differential profile. In addition, the second peak (Ec (4)) is a peak at which the slope changes from positive to negative in the capacity-voltage differential profile. That is, the second peak (Ec (4)) may be any one of peaks corresponding to a local maximum value in the capacity-voltage differential profile. Here, the local maximum value refers to a point at which the slope changes from positive to negative in the capacity-voltage differential profile. For example, referring to FIGS. 3 and 4, the first peak (Ea (1)), the reference peak (Ref P) and the second peak (Ec (4)) may all be peaks corresponding to the local maximum value.

In addition, the second peak (Ec (4)) may be a peak at which the corresponding voltage is largest. That is, since the second peak (Ec (4)) is a peak that appears near the charging terminal of the battery cell 10, the second peak (Ec (4)) may be a peak at which the corresponding voltage is largest, even in the high potential section.

For example, assuming that the maximum operational voltage of the battery cell 10 is 4.2V, the second peak (Ec (4)) may appear around about 4.1V. This is because lithium ions move from the positive electrode to the negative electrode during the charging process of the battery cell 10, and the change pattern may appear best near the charging terminal of the battery cell 10 when the positive electrode reaction area decreases.

Therefore, the battery management apparatus 100 according to an embodiment of the present disclosure has an advantage of diagnosing whether the positive electrode reaction area of the battery cell 10 is reduced, based on the change pattern of the second peak (Ec (4)) that represents the decrease of the positive electrode reaction area best. Therefore, the state of the battery cell 10 may be diagnosed more independently and accurately.

Figure 6:
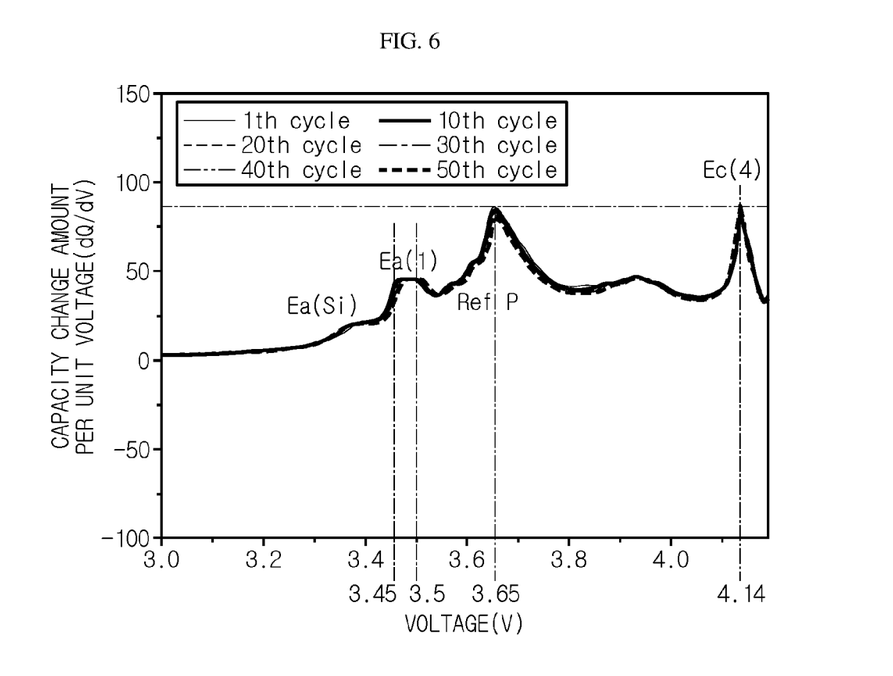
FIG. 6 is a diagram schematically showing a capacity-voltage differential profile of a first battery cell according to a charging cycle.

FIG. 6 is a diagram schematically showing a capacity-voltage differential profile of a first battery cell according to a charging cycle.

For convenience of explanation, in the capacity-voltage differential profile of the first battery cell shown in FIG. 6, it is assumed that the first peak (Ea (1)) is a peak located near about 3.45V to 3.5V based on the voltage, and the reference peak (Ref P) is a peak located near about 3.65V based on voltage. In addition, it is assumed that the second peak (Ec (4)) is a peak located near about 4.14V based on voltage.

The first battery cell is a battery cell 10 in which graphite and silicon are mixed in a negative electrode active material. Accordingly, in FIG. 6, a silicon peak (Ea (Si)) may appear based on the silicon included in the first battery cell.

It may be found that as the charging cycle of the first battery cell increases, the voltage of the first peak (Ea (1)) of the capacity-voltage differential profile is moved toward a high potential. For example, in the first charging cycle of the first battery cell, the voltage of the first peak (Ea (1)) is about 3.45V, but in the 50$^{th}$ charging cycle, the voltage of the first peak (Ea (1)) is about 3.5V. The movement of the voltage of the first peak (Ea (1)) toward a high potential may be regarded as a result of the loss of available lithium in the first battery cell. Accordingly, the control unit 130 may diagnose that available lithium in the first battery cell is lost.

However, it may be found that even if the charging cycle of the first battery cell increases, the capacity change amount per unit voltage of the second peak (Ec (4)) in the capacity-voltage differential profile is constant. Therefore, the control unit 130 may diagnose that the positive electrode reaction area of the first battery cell is not reduced.

In summary, the control unit 130 may diagnose the state of the first battery cell as a state where available lithium is lost but the positive electrode reaction area is not reduced.

Figure 7:
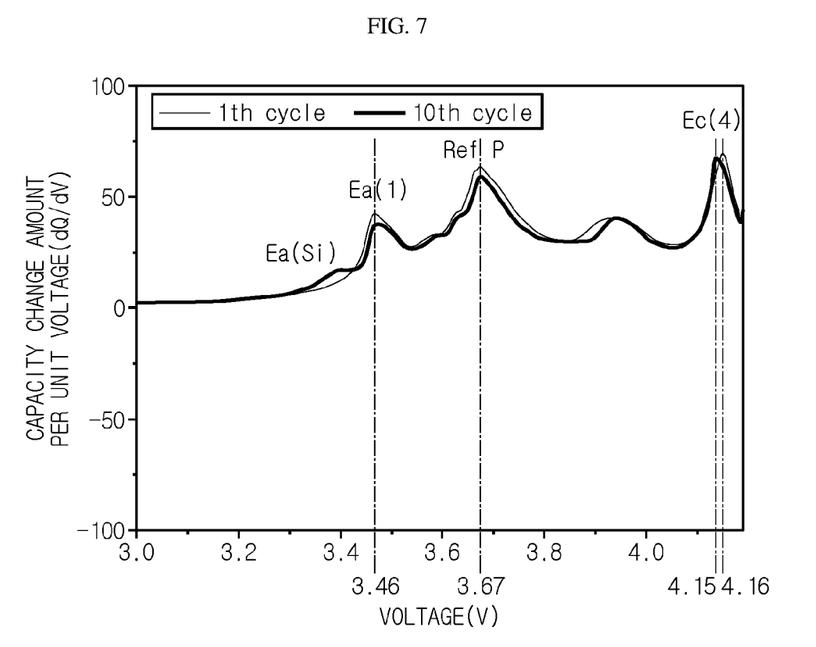
FIG. 7 is a diagram schematically showing a capacity-voltage differential profile of a second battery cell according to a charging cycle.

FIG. 7 is a diagram schematically showing a capacity-voltage differential profile of a second battery cell according to a charging cycle.

For convenience of explanation, in the capacity-voltage differential profile of the second battery cell shown in FIG. 7, it is assumed that the first peak (Ea (1)) is a peak located near about 3.46V based on voltage, and the reference peak (Ref P) is a peak located near about 3.67V based on voltage. In addition, it is assumed that the second peak (Ec (4)) is a peak located near about 4.15V to 4.16V based on voltage.

Like the first battery cell, the second battery cell is a battery cell 10 in which graphite and silicon are mixed in a negative electrode active material. Accordingly, in FIG. 7, an Ea (Si) peak may appear based on the silicon included in the second battery cell.

It may be found that even if the charging cycle of the second battery cell increases, the voltage of the first peak (Ea (1)) of the capacity-voltage differential profile is constant. For example, the voltages of the first peak (Ea (1)) in the first charging cycle and the 100$^{th}$ charging cycle of the second battery cell are identical as about 3.46V. Therefore, the control unit 130 may diagnose that the available lithium of the second battery cell is not lost.

However, it may be found that as the charging cycle of the second battery cell increases, the capacity change amount per unit voltage of the second peak (Ec (4)) in the capacity-voltage differential profile decreases. The decrease in the capacity change amount per unit voltage of the second peak (Ec (4)) may be regarded as a result of the decrease in the positive electrode reaction area of the second battery cell. Therefore, the control unit 130 may diagnose that the positive electrode reaction area of the second battery cell is reduced.

In summary, the control unit 130 may diagnose the state of the second battery cell as a state where the available lithium is not lost but the positive electrode reaction area is reduced.

Figure 8:
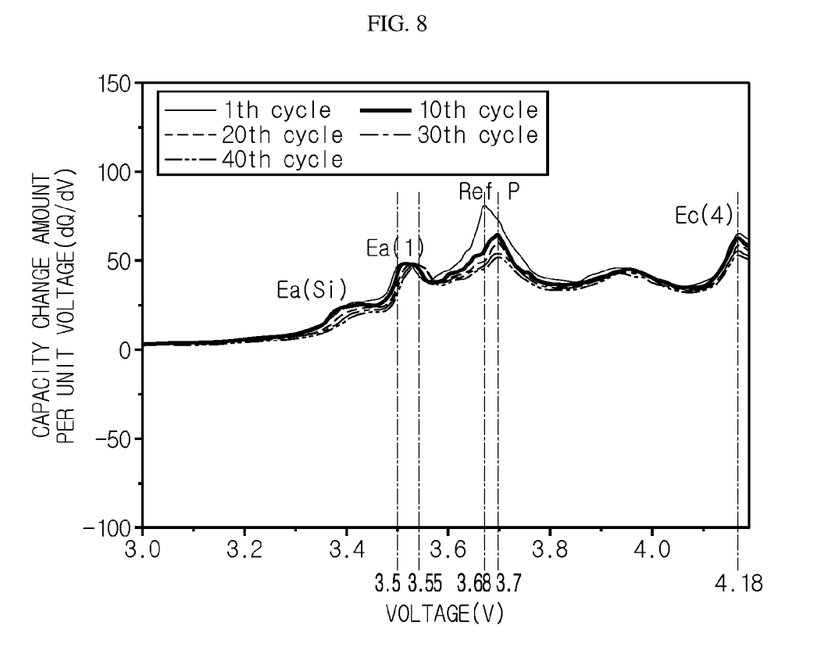
FIG. 8 is a diagram schematically showing a capacity-voltage differential profile of a third battery cell according to a charging cycle.

FIG. 8 is a diagram schematically showing a capacity-voltage differential profile of a third battery cell according to a charging cycle.

For convenience of explanation, in the capacity-voltage differential profile of the third battery cell shown in FIG. 8, it is assumed that the first peak (Ea (1)) is a peak located near about 3.5V to 3.55V based on voltage, and the reference peak (Ref P) is a peak located near about 3.7V based on voltage. In addition, it is assumed that the second peak (Ec (4)) is a peak located near about 4.18V based on voltage.

Like the first battery cell and the second battery cell, the third battery cell is a battery cell 10 in which graphite and silicon are mixed in a negative electrode active material. Accordingly, in FIG. 8, an Ea (Si) peak may appear based on the silicon included in the third battery cell.

It may be found that as the charging cycle of the third battery cell increases, the voltage of the first peak (Ea (1)) in the capacity-voltage differential profile is moved toward a high potential. For example, in the first charging cycle of the third battery cell, the voltage of the first peak (Ea (1)) is about 3.5V, but in the 400$^{th}$ charging cycle, the voltage of the first peak (Ea (1)) is about 3.55V. The movement of the voltage of the first peak (Ea (1)) toward a high potential may be regarded as a result of the loss of available lithium in the third battery cell. Therefore, the control unit 130 may diagnose that the available lithium of the third battery cell is lost.

In addition, it may be found that as the charging cycle of the third battery cell increases, the capacity change amount per unit voltage of the second peak (Ec (4)) in the capacity-voltage differential profile decreases. The decrease in the capacity change amount per unit voltage of the second peak (Ec (4)) may be regarded as a result of the decrease in the positive electrode reaction area of the third battery cell. Therefore, the control unit 130 may diagnose that the positive electrode reaction area of the third battery cell is reduced.

In summary, the control unit 130 may diagnose the state of the third battery cell as a state where available lithium is lost and the positive electrode reaction area is reduced.

The control unit may be configured to change at least one of a threshold value of a charging or discharging C-rate of the battery cell and an operational voltage range of the battery cell based on the result of diagnosing the state of the battery cell.

Specifically, if the control unit diagnoses that the available lithium of the battery cell is lost or the positive electrode reaction area is reduced, an upper limit threshold value of the charging and discharging C-rate may be changed and set to slow the degradation rate of the battery cell. Preferably, the control unit may change the upper limit of the charging and discharging C-rate of the battery cell. For example, if the charging and discharging C-rate of the battery cell is initially set to a maximum value, the control unit may change the upper limit threshold value of the charging and discharging C-rate of the battery cell to a 90% level of the maximum value.

In addition, if it is diagnosed that the available lithium of the battery cell is lost or the positive electrode reaction area is reduced, the control unit may change the operational voltage range of the battery cell. For example, if the operational voltage range of the battery cell is initially set to 3.6V to 4.2V, the control unit may change the operational voltage range of the battery cell to 3.7V to 4.1V. As a result, overcharging and/or over-discharging of the degraded battery cell may be prevented in advance.

The battery management apparatus 100 according to an embodiment of the present disclosure may be applied to a battery management system (BMS). That is, the BMS according to the present disclosure may include the battery management apparatus 100 according to the present disclosure described above. In this configuration, at least some components of the battery management apparatus 100 according to the present disclosure may be implemented by supplementing or adding functions of components included in a conventional BMS. For example, the measuring unit 110, the storage unit 120 and the control unit 130 of the battery management apparatus 100 according to the present disclosure may be implemented as components of the BMS.

In addition, the battery management apparatus 100 according to the present disclosure may be provided to a battery pack 1. That is, the battery pack 1 according to the present disclosure may include the battery management apparatus 100 according to the present disclosure described above. Here, the battery pack 1 may include at least one battery cell 10, the battery management apparatus 100, electrical equipment (including a BMS, a relay, a fuse, etc.), and a case.

Figure 9:
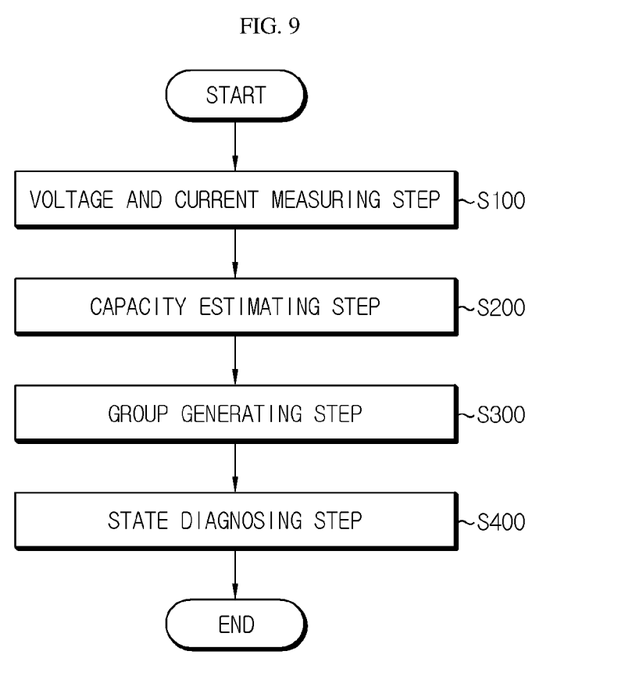
FIG. 9 is a diagram schematically showing a battery management method according to another embodiment of the present disclosure.

FIG. 9 is a diagram schematically showing a battery management method according to another embodiment of the present disclosure.

The battery management method according to another embodiment of the present disclosure may be performed by the battery management apparatus according to an embodiment of the present disclosure.

Referring to FIG. 9, the battery management method according to another embodiment of the present disclosure may include a voltage and current measuring step (S100), a capacity estimating step (S200), a group generating step (S300), and a state diagnosing step (S400).

The voltage and current measuring step (S100) is a step of measuring a voltage and current of a battery cell while the battery cell is being charged or discharged, in a charging and discharging cycle of the battery cell, and may be performed by the measuring unit 110.

The measuring unit 110 may measure a positive electrode potential and a negative electrode potential of the battery cell 10, and measure the voltage of the battery cell 10 by obtaining a difference between the measured positive electrode potential and the measured negative electrode potential.

In addition, the measuring unit 110 may measure a charging and discharging current of the battery cell 10 by means of a voltmeter A provided on a charging and discharging path of the battery cell 10.

The capacity estimating step S200 is a step of estimating a capacity of the battery cell based on the current of the battery cell measured in the measuring step S100, and may be performed by the control unit 130.

The control unit 130 may estimate the capacity of the battery cell 10 using the Ampere counting method. Here, the capacity of the battery cell 10 may be a state of charge (SOC) of the battery cell 10.

The group generating step (S300) is a step of generating a group of charging and discharging cycles having the same charging and discharging C-rate, and may be performed by the control unit 130.

First, the storage unit 120 may store a capacity-voltage differential profile and a charging and discharging C-rate in every charging and discharging cycle of the battery cell 10. The control unit 130 may generate a group of charging and discharging cycles having the same charging and discharging C-rate among the charging and discharging cycles stored in the storage unit 120.

For example, it is assumed that the charging C-rate in the first charging cycle, the second charging cycle and the third charging cycle is 0.33 C, and the charging C-rate in the fourth charging cycle, the fifth charging cycle and the sixth charging cycle is 0.2 C. The capacity-voltage differential profile and the charging C-rate of the first to sixth charging cycles may be stored in the storage unit 120. The control unit 130 may generate a first group including the first charging cycle, the second charging cycle and the third charging cycle having the same charging C-rate, and generate a second group including the fourth charging cycle, the fifth charging cycle and the sixth charging cycle. That is, the charging and discharging cycles included in one group are charged and discharged with the same charging and discharging C-rate.

The state diagnosing step S400 is a step of diagnosing the state of the battery cell by comparing the capacity-voltage differential profiles corresponding to the charging and discharging cycles included in the same group with each other, and may be performed by the control unit 130.

The control unit 130 may select charging and discharging cycles included in a group for each group in order to select charging and discharging cycles charged or discharged at the same charging and discharging C-rate.

The control unit 130 may select a capacity-voltage differential profile corresponding to the selected charging and discharging cycle among the capacity-voltage differential profiles stored in the storage unit 120. In addition, the control unit 130 may diagnose the state of battery cell 10 by comparing the selected capacity-voltage differential profiles with each other.

Specifically, the control unit 130 may extract a first peak associated with the loss of available lithium of the battery cell 10 from each selected capacity-voltage differential profile. The control unit 130 may diagnose whether available lithium of the battery cell 10 is lost according to whether the voltage of the first peak in the selected capacity-voltage differential profile moves toward a high potential as the charging and discharging cycles progress.

In addition, the control unit 130 may extract a second peak associated with the positive electrode reaction area of the battery cell 10 from each selected capacity-voltage differential profile. The control unit 130 may diagnose whether the positive electrode reaction area of the battery cell 10 is reduced according to whether the capacity change amount per unit voltage of the second peak in the selected capacity-voltage differential profile decreases as the charging and discharging cycles progress.

Preferably, the control unit 130 may diagnose the state of the battery cell 10 by comparing the capacity-voltage profiles stored in advance in the storage unit 120, as well as diagnose a current state of the battery cell 10 in real time by using a new capacity-voltage profile generated in a state where the battery cell 10 is running.

That is, the control unit 130 may compare the generated new capacity-voltage profile with the capacity-voltage profile stored in advance in the storage unit 120 to diagnose whether available lithium of the battery cell 10 is lost and whether the positive electrode reaction area is reduced.

Therefore, the battery management method according to another embodiment of the present disclosure may diagnose the state of the battery cell 10 even while the battery cell 10 is running. In addition, as the capacity-voltage profiles of the battery cell 10 are accumulated more, the accuracy and reliability of diagnosis on the state of the battery cell 10 may be improved further.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
10: battery cell
100: battery management apparatus
110: measuring unit
120: storage unit
130: control unit
A: voltmeter
PB: reference profile
P1: first capacity-voltage differential profile
P2: second capacity-voltage differential profile
Ea 1: first peak
Ec (4): second peak
Ref P: reference peak

What is claimed is:

1. A battery management apparatus, comprising:
a voltage sensor and a current sensor configured to measure a voltage and current of a battery cell, respectively, while the battery cell is being charged or discharged, for a plurality of charging and discharging cycles of the battery cell;
a control unit configured to estimate, for each charging and discharging cycle, a capacity of the battery cell based on the measured current of the battery cell during the charging and discharging cycle; and
memory configured to store:
a respective capacity-voltage differential profile generated based on the measured voltage of the battery cell and the corresponding estimated capacity of the battery cell for each charging and discharging cycle; and
a respective charging and discharging current rate (C-rate) for each charging and discharging cycle,
wherein the control unit is configured to:
generate a subset of the plurality of charging and discharging cycles having a common charging and discharging C-rate; and
diagnose a state of the battery cell based on a comparison of capacity-voltage differential profiles of the subset of charging and discharging cycles with each other.

2. The battery management apparatus according to claim 1,
wherein the control unit is configured to:
estimate a new capacity of the battery cell based on the measured current of the battery cell during a new charging and discharging cycle,
generate a new capacity-voltage differential profile based on the measured voltage during the new charging and discharging cycle and the estimated new capacity,
generate a plurality of subsets of charging and discharging cycles,
select a predetermined subset from among the plurality of generated subsets, and
diagnose a state of the battery cell based on a change pattern between the capacity-voltage differential profiles of the charging and discharging cycles of the selected predetermined group subset and the new capacity-voltage differential profile.

3. The battery management apparatus according to claim 2,
wherein the predetermined subset is a subset of the plurality of charging and discharging cycles having a common charging and discharging C-rate equal to the charging and discharging C-rate of the new charging and discharging cycle.

4. The battery management apparatus according to claim 1,
wherein the control unit is configured to:
extract for each capacity-voltage differential profile of subset of charging and discharging cycles, at least one of a first peak associated with loss of available lithium in the battery cell and a second peak associated with a positive electrode reaction area, and
diagnose the state of the battery cell based on a change pattern of at least one of the plurality of extracted first peaks and the plurality of extracted second peaks.

5. The battery management apparatus according to claim 4,
wherein the control unit is configured to diagnose the state of the battery cell as a state where the available lithium of the battery cell is lost, in response to a measured voltage of the plurality of first peaks increasing as the charging and discharging cycles progress.

6. The battery management apparatus according to claim 4,
wherein the control unit is configured to diagnose the state of the battery cell as a state where the positive electrode reaction area of the battery cell decreases, in response to a capacity change amount per unit voltage of the plurality of second peaks decreasing as the charging and discharging cycles progress.

7. The battery management apparatus according to claim 4,
wherein the control unit is configured to:
extract a plurality of peaks from each capacity-voltage differential profile,
select, from among the plurality of extracted peaks, a reference peak satisfying a predetermined condition, and
extract at least one of the first peak or the second peak based on the voltage and the capacity change amount per unit voltage of the selected reference peak.

8. The battery management apparatus according to claim 7,
wherein the reference peak is a peak at which a positive electrode peak and a negative electrode peak of the battery cell overlap.

9. The battery management apparatus according to claim 7,
wherein the control unit is configured to extract the first peak from among the plurality of extracted peaks, wherein a voltage of the first peak is lower than the voltage of the reference peak.

10. The battery management apparatus according to claim 9,
wherein a capacity change amount per unit voltage of the first peak is closest, from among the plurality of peaks having a voltage less than the voltage of the reference peak, to the capacity change amount per unit voltage of the reference peak.

11. The battery management apparatus according to claim 7,
wherein the control unit is configured to extract the second peak from among the plurality of extracted peaks, wherein a voltage of the second peak is greater than the voltage of the reference peak.

12. The battery management apparatus according to claim 11,
wherein the second peak has a slope that changes from positive to negative and the corresponding voltage and is largest from among the plurality of extracted peaks having a voltage greater than the voltage of the reference peak.

13. The battery management apparatus according to claim 1,
wherein the control unit is configured to change at least one of a threshold value of the charging and discharging C-rate of the battery cell or an operational voltage range of the battery cell based on the diagnosed state of the battery cell.

14. A battery pack, comprising the battery management apparatus according to claim 1.

15. A battery management method, comprising:
a voltage and current of a battery cell while the battery cell is being charged or discharged, for a plurality of charging and discharging cycles of the battery cell;
estimating, for each charging and discharging cycle, a capacity of the battery cell based on the measured current of the battery cell during the charging and discharging cycle;
generating a subset of the plurality of charging and discharging cycles having a common charging and discharging C-rate; and
diagnosing a state of the battery cell based on a comparison of capacity-voltage differential profiles of the subset of charging and discharging cycles with each other.

* * * * *